(12) United States Patent
Umemoto et al.

(10) Patent No.: US 7,265,071 B2
(45) Date of Patent: *Sep. 4, 2007

(54) DIELECTRIC CERAMIC COMPOSITION AND MULTILAYER CERAMIC PART USING THE SAME

(75) Inventors: Takashi Umemoto, Hirakata (JP); Rintaro Aoyagi, Nagareyama (JP); Hiroshi Nonoue, Hirakata (JP); Kenichiro Wakisaka, Iga (JP)

(73) Assignee: Sanyo Electric Co., Ltd., Osaka (JP)

( * ) Notice: Subject to any disclaimer, the term of this patent is extended or adjusted under 35 U.S.C. 154(b) by 74 days.

This patent is subject to a terminal disclaimer.

(21) Appl. No.: 11/056,397

(22) Filed: Feb. 14, 2005

(65) Prior Publication Data
US 2005/0209090 A1   Sep. 22, 2005

(30) Foreign Application Priority Data
Mar. 17, 2004   (JP) ............................. 2004-076052

(51) Int. Cl.
*C04B 35/462* (2006.01)
*C04B 35/465* (2006.01)

(52) U.S. Cl. ..................... 501/134; 501/136; 428/210; 428/702

(58) Field of Classification Search ........ 501/134–136; 428/210, 702
See application file for complete search history.

(56) References Cited

U.S. PATENT DOCUMENTS

| | | | |
|---|---|---|---|
| 4,468,471 A * | 8/1984 | Kashima et al. ............ | 501/135 |
| 5,188,993 A | 2/1993 | Takahashi et al. | |
| 5,320,991 A | 6/1994 | Takahashi et al. | |
| 5,403,796 A * | 4/1995 | Takahashi et al. .......... | 501/136 |
| 5,444,028 A * | 8/1995 | Takahashi et al. .......... | 501/136 |
| 6,221,799 B1 | 4/2001 | Takase et al. | |
| 6,385,035 B1 * | 5/2002 | Matoba et al. ........... | 361/321.1 |
| 6,777,362 B2 * | 8/2004 | Fukagawa et al. .......... | 501/136 |
| 6,846,767 B2 * | 1/2005 | Kim et al. .................. | 501/136 |
| 7,153,800 B2 * | 12/2006 | Umemoto et al. .......... | 501/136 |
| 2003/0100428 A1 | 5/2003 | Kim et al. | |

FOREIGN PATENT DOCUMENTS

| | | | |
|---|---|---|---|
| DE | 1646723 | * | 3/1972 |
| JP | 48082400 | * | 11/1973 |
| JP | 75023519 | * | 8/1975 |
| JP | 5-211007 | | 8/1993 |
| JP | 6-243722 | | 9/1994 |
| JP | 8-45344 | | 2/1996 |
| JP | 2000-86338 A | | 3/2000 |
| JP | 2000-335964 A | | 12/2000 |
| JP | 2003-146742 A | | 5/2003 |

* cited by examiner

*Primary Examiner*—Karl Group
(74) *Attorney, Agent, or Firm*—McDermott Will & Emery LLP

(57) ABSTRACT

A dielectric ceramic composition characterized as containing a dielectric material which contains a dielectric composition represented by the compositional formula $a \cdot Li_2O - b \cdot (CaO_{1-x} - SrO_x) - c \cdot R_2O_3 - d \cdot TiO_2$ (wherein x satisfies $0 \leq x < 1$; R is at least one selected from La, Y and other rare-earth metals; and a, b, c and d satisfy $0 \leq a \leq 20$ mol %, $0 \leq b \leq 45$ mol %, $0 < c \leq 20$ mol % and $40 \leq d \leq 80$ mol %) and at least one of oxides of Group 4 and Group 14 metallic elements of the Periodic Table.

7 Claims, 1 Drawing Sheet

DIELECTRIC CERAMIC COMPOSITION AND MULTILAYER CERAMIC PART USING THE SAME

The priority Japanese Patent Application Number 2004-76052 upon which this patent application is based is hereby incorporated by reference.

BACKGROUND OF THE INVENTION

1. Field of the Invention

The present invention relates to a dielectric ceramic composition for use in multilayer ceramic parts and the like, and also to multilayer ceramic parts using the composition.

2. Description of Related Art

With the recent reduction in size and thickness of electronic parts, there is an increasing need for multilayer ceramic parts. A typical multilayer ceramic part includes, in each layer thereof, an inductor or capacitor circuit formed by using a low temperature co-fired ceramic (LTCC) which is co-firable with a conductive material such as Ag. Generally, a dielectric ceramic composition containing alumina or other ceramic filler and a glass is used as the low temperature co-fired ceramic for use in multilayer ceramic parts. However, such a composition has a low dielectric constant of 10 or below and, when applied to an LC filer, shows insufficient dielectric characteristics.

In order for a dielectric ceramic composition to be applicable to an LC filter, it must exhibit a high dielectric constant, a low dielectric loss and a temperature coefficient $\tau f$ of approximately 0. As a composition which meets such characteristics, a dielectric ceramic composition having a composition of $Li_2O$—$CaO$—$Sm_2O_3$—$TiO_2$ is disclosed in Japanese Patent Laying-Open No. Hei 5-211007.

Also, Japanese Patent Laying-Open No. 2003-146742 discloses a dielectric ceramic composition containing $xCaO$—$y_1Sm_2O_3$-$y_2Nd_2O_3$-$wLi_2O$-$zTiO_2$ and 3–15% by weight of a $ZnO$—$B_2O_3$—$SiO_2$ based glass frit or an $Li_2O$—$B_2O_3$—$SiO_2$ based glass frit.

However, the dielectric ceramic composition disclosed in Japanese Patent Laying-Open No. Hei 5-211007 is fired at a high temperature of about 1,300° C. and its original composition has made it difficult to be applied to multilayer ceramic parts which require firing at a low temperature of about 900° C.–about 1,000° C.

The dielectric ceramic composition disclosed in Japanese Patent Laying-Open No. 2003-146742 needs to increase its glass loading in order to improve sinterability at a low temperature of about 900° C.–about 1,000° C. The higher glass loading results in deterioration of dielectric characteristics, which has been a problem.

SUMMARY OF THE INVENTION

It is an object of the present invention to provide a dielectric ceramic composition which can be fired at a low temperature of about 900° C.–about 1,000° C. without marked deterioration of dielectric characteristics, as well as providing multilayer ceramic parts using the dielectric ceramic composition.

The dielectric ceramic composition of the present invention is characterized as containing a dielectric material which contains a dielectric composition represented by the compositional formula $a.Li_2O$-$b.(CaO_{1-x}$—$SrO_x)$-$c.R_2O_3$-$d.TiO_2$ (wherein x satisfies $0 \leq x < 1$; R is at least one selected from La, Y and other rare-earth metals; and a, b, c and d satisfy $0 \leq a \leq 20$ mol %, $0 \leq b \leq 45$ mol %, $0 < c \leq 20$ mol % and $40 \leq d \leq 80$ mol %) and at least one of oxides of Group 4 and Group 14 metallic elements of the Periodic Table.

The dielectric material of the present invention contains the dielectric composition represented by the above-specified compositional formula and at least one of oxides of Group 4 and Group 14 metallic elements of the Periodic Table. Addition of such metallic oxide to the dielectric composition improves sinterability even at a low temperature of about 1,000° C. and enables firing without marked deterioration of dielectric characteristics.

An example of the dielectric composition represented by the above-specified compositional formula can be found in Japanese Patent Laying-Open No. Hei 5-211007. Therefore, addition of an oxide of any metallic element from the Periodic Group 4 and 14 to the dielectric composition disclosed in Japanese Patent Laying-Open No. Hei 5-211007 as having the above-specified compositional formula results in a composition useful as the dielectric material of the present invention.

In the dielectric material of the present invention, the metallic element may substitute for a Ti site in the dielectric composition. The metallic oxide content e of the dielectric material is preferably within the range $0 < e \leq 80$ mol %, more preferably within the range $10 \leq e \leq 50$ mol %, further preferably within the range $10 \leq e \leq 30$ mol %. If the metallic oxide content is excessively low, the effect of the present invention that renders the composition firable at a low temperature may not be obtained sufficiently. On the other hand, if the metallic oxide content is excessively high, dielectric characteristics may deteriorate. In the case where, other than the dielectric composition, the dielectric material of the present invention contains the metallic oxide alone, a, b, c, d and e are selected such that they make a total of 100 mol %.

As described above, the metallic element belongs to Group 4 and Group 14 elements of the Periodic Table. Examples of Group 4 metallic elements are Zr and Hf. Examples of Group 14 metallic elements are Si, Ge, Sn and Pb. Among them, Si, Ge and Sn are preferably used. Accordingly, examples of preferred metallic oxides in the present invention are $SiO_2$, $GeO_2$, $SnO_2$, $ZrO_2$ and $HfO_2$.

Preferably, the dielectric material of the present invention further contains $Bi_2O_3$. Further inclusion of $Bi_2O_3$ in the dielectric material improves sinterability at a low temperature and ameliorates dielectric characteristics. The $Bi_2O_3$ content is preferably up to 30 mol %, more preferably 2–10 mol %. In the case where the dielectric material of the present invention further contains $Bi_2O_3$, the values of a, b, c, d and ($Bi_2O_3$ content) are suitably selected such that they make a total of 100 mol %. If the $Bi_2O_3$ content is excessively low, the effect of adding $Bi_2O_3$, i.e., the improvement of sinterability and dielectric characteristics may not be obtained sufficiently. If the $Bi_2O_3$ content is excessively high, dielectric characteristics may deteriorate. Bi may substitute for an R site in the dielectric material.

Besides the aforementioned dielectric material, the dielectric ceramic composition of the present invention may further contain a glass component. Inclusion of the glass component further improves sinterability at a low temperature.

Examples of the glass component for use in the present invention include bismuth based glass comprised mainly of $Bi_2O_3$ and $B_2O_3$, borosilicate based glass comprised mainly of $B_2O_3$ and $SiO_2$, and zinc borosilicate based glass comprised mainly of $ZnO$, $B_2O_3$ and $SiO_2$.

The dielectric ceramic composition preferably contains the glass component in the range of 0–10% by weight, more preferably in the range 1–7% by weight, based on a total weight of the composition. If the content of the glass component is excessively low, the effect of adding the glass component, i.e., a sinterability improvement may not be obtained sufficiently. For example, there encounters an occasion where firing can not be accomplished at 900° C. On the other hand, if the content of the glass component is excessively high, dielectric characteristics may deteriorate.

The multilayer ceramic part of the present invention is characterized in that it is obtained by laminating a dielectric layer formed from a slurry containing the dielectric ceramic composition of the present invention with a conductive layer.

In accordance with the present invention, a dielectric ceramic composition can be provided which is firable at a low temperature of about 900° C.– about 1,000° C. without marked deterioration of dielectric characteristics. Therefore, in accordance with the present invention, a low temperature co-fired ceramic can be provided which is co-firable with a conductive material such as Ag.

DESCRIPTION OF THE PREFERRED EXAMPLES

Figure 1:
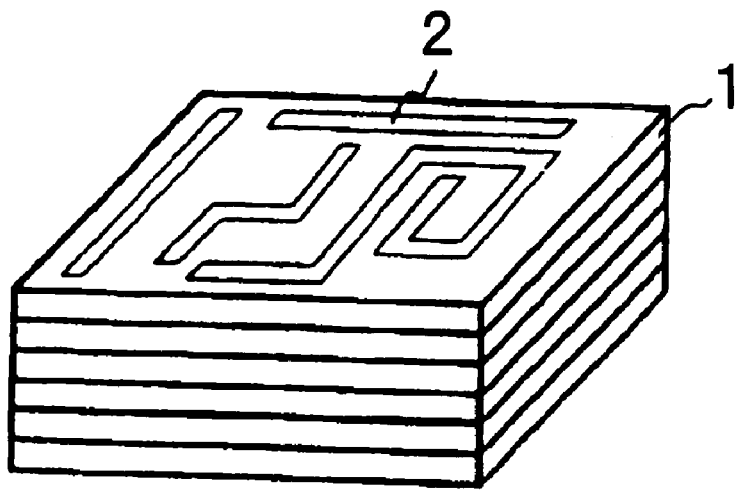
FIG. 1 is a perspective view which shows an embodiment of a multilayer ceramic part in accordance with the present invention.

The present invention is now described in detail with reference to examples. The following examples illustrate the practice of the present invention but are not intended to be limiting thereof. Suitable changes and modifications can be effected without departing from the scope of the present invention.

$Li_2CO_3$, $CaCO_3$, $SrCO_3$, $Sm_2O_3$ and $TiO_2$, and $Bi_2O_3$, $SiO_2$, $GeO_2$, $SnO_2$, $ZrO_2$ and $HfO_2$ were weighed following the compositional ratio specified in Table 1, in terms of oxide, and then mixed. After addition of isopropanol, the mixture was wet mixed for 5–24 hours using a ball mill consisting of a zirconia pot and a ball, and thereafter calcined at 700–1,200° C. for 1–5 hours to obtain a calcined product. This calcined product was pulverized using the ball mill for 24 hours to obtain a dielectric material.

The obtained dielectric material was granulated with the addition of a binder such as polyvinyl alcohol, classified and then pressed under a pressure of 2,000 kg/cm² into a product having a predetermined size and shape. This product was heated at 500° C. for 2 hours for a debindering treatment and then fired at 1,000° C. for 5 hours to obtain a sample.

Sample Nos. 1–12 are dielectric materials in accordance with the present invention. Sample No. 13 is a comparative dielectric material.

TABLE 1

| Sample No. | Composition(mol %) | | | | | | | | | | |
|---|---|---|---|---|---|---|---|---|---|---|---|
| | $Li_2O$ | CaO | SrO | $Sm_2O_3$ | $TiO_2$ | $Bi_2O_3$ | $SiO_2$ | $GeO_2$ | $SnO_2$ | $ZrO_2$ | $HfO_2$ |
| 1 | 9 | 15 | 1 | 12 | 53 | 0 | 10 | 0 | 0 | 0 | 0 |
| 2 | 9 | 15 | 1 | 12 | 43 | 0 | 20 | 0 | 0 | 0 | 0 |
| 3 | 9 | 15 | 1 | 12 | 33 | 0 | 30 | 0 | 0 | 0 | 0 |
| 4 | 9 | 15 | 1 | 10 | 43 | 2 | 20 | 0 | 0 | 0 | 0 |
| 5 | 9 | 15 | 1 | 8 | 43 | 4 | 20 | 0 | 0 | 0 | 0 |
| 6 | 9 | 15 | 1 | 6 | 43 | 6 | 20 | 0 | 0 | 0 | 0 |
| 7 | 9 | 15 | 1 | 4 | 43 | 8 | 20 | 0 | 0 | 0 | 0 |
| 8 | 9 | 15 | 1 | 2 | 43 | 10 | 20 | 0 | 0 | 0 | 0 |
| 9 | 9 | 15 | 1 | 8 | 43 | 4 | 0 | 20 | 0 | 0 | 0 |
| 10 | 9 | 15 | 1 | 8 | 43 | 4 | 0 | 0 | 20 | 0 | 0 |
| 11 | 9 | 15 | 1 | 8 | 43 | 4 | 0 | 0 | 0 | 20 | 0 |
| 12 | 9 | 15 | 1 | 8 | 43 | 4 | 0 | 0 | 0 | 0 | 20 |
| 13 | 9 | 15 | 1 | 12 | 63 | 0 | 0 | 0 | 0 | 0 | 0 |

Each sample (Sample Nos. 1–13) was subjected to measurement of dielectric constant and Qf value by a dielectric resonator method (Hakki-Coleman method).

TABLE 2

| Sample No. | Firing Temperature (° C.) | Shrinkage (%) | Dielectric Constant | Qf (GHz) |
|---|---|---|---|---|
| 1 | 1000 | 10.1 | 75 | 3780 |
| 2 | 1000 | 11.1 | 90 | 4000 |
| 3 | 1000 | 11.2 | 82 | 3220 |
| 4 | 1000 | 14.8 | 98 | 3800 |
| 5 | 1000 | 15.1 | 113 | 4000 |
| 6 | 1000 | 15.1 | 112 | 3230 |
| 7 | 1000 | 15.3 | 112 | 3190 |
| 8 | 1000 | 15.5 | 99 | 2200 |
| 9 | 1000 | 14.1 | 108 | 2990 |
| 10 | 1000 | 14.8 | 102 | 3100 |
| 11 | 1000 | 12.1 | 98 | 2800 |
| 12 | 1000 | 11.2 | 85 | 3000 |
| 13 | 1200 | 15.5 | 115 | 4800 |
|  | 1000 | 8.5 | 59 | 3000 |

As can be clearly seen from the results shown in Table 2, the comparative sample No. 13 shows a high shrinkage and good electric characteristics when it is fired at 1,200° C. However, firing at 1,000° C. lowers its shrinkage and deteriorates its dielectric characteristics. In contrast, each of the sample Nos. 1–12 in accordance with the present invention shows a high shrinkage and good dielectric characteristics even when it is fired at a low temperature of 1,000° C. This demonstrates that addition of an oxide of any metallic element from the Periodic Group 4 and 14 in the dielectric material, in accordance with the present invention, improves sinterability and results in obtaining good dielectric characteristics.

From comparison between the $Bi_2O_3$-containing samples (e.g., sample Nos. 4–8) and the $Bi_2O_3$-excluding sample Nos. 1–3, it is clear that the $Bi_2O_3$-containing samples, when fired, exhibit higher shrinkage and superior dielectric characteristics. This therefore demonstrates that inclusion of $Bi_2O_3$ in the dielectric material improves sinterability and results in obtaining better dielectric characteristics.

Subsequently, a glass component was added to the dielectric material sample No. 5 to prepare a dielectric ceramic composition and its sinterability and dielectric characteristics were evaluated. As the glass component, the following substances (G1) and (G2) were used:

(G1) $Bi_2O_3$ (55% by weight)—$B_2O_3$ (35% by weight)—ZnO (10% by weight)

(G2) $Bi_2O_3$ (75% by weight)—$B_2O_3$ (15% by weight)—ZnO (10% by weight).

The glass component was added when the calcined product was pulverized, so that they were pulverized and mixed together. For a comparative purpose, the glass component was also added to the comparative sample No. 13 to prepare a dielectric porcelain for evaluation. Other samples without the glass component were also evaluated in a similar manner. The firing temperature was set at 0.900°. The evaluation results are shown in Table 3.

TABLE 3

| Sample No. | Glass Component | Loading of Glass Component (% by weight) | Firing Temperature (° C.) | Shrinkage (%) | Dielectric Constant | Qf (GHz) |
|---|---|---|---|---|---|---|
| 5 | None | 0 | 900 | <0.5 | Immeasurable | Immeasurable |
| 13 | None | 0 | 900 | <0.5 | Immeasurable | Immeasurable |
| 5 | G1 | 5 | 900 | 14.8 | 91 | 2133 |
| 13 | G1 | 5 | 900 | 10.5 | 62 | 1437 |
| 5 | G2 | 5 | 900 | 15.1 | 98 | 1810 |
| 13 | G2 | 5 | 900 | 12.0 | 68 | 1009 |

As can be seen from the results shown in Table 3, without addition of the glass component, the samples resulted in poor sinterability and failure of firing at 900° C. Addition of the glass component enabled firing at 900° C. As can also be seen, the dielectric ceramic compositions containing the sample No. 5 and the glass component, in accordance with the present invention, exhibit higher shrinkage and improved sinterability when fired at a low temperature of 900° C., compared to those containing the comparative sample No. 13 and the glass component. They are also found to exhibit superior dielectric characteristics.

Figure 2:
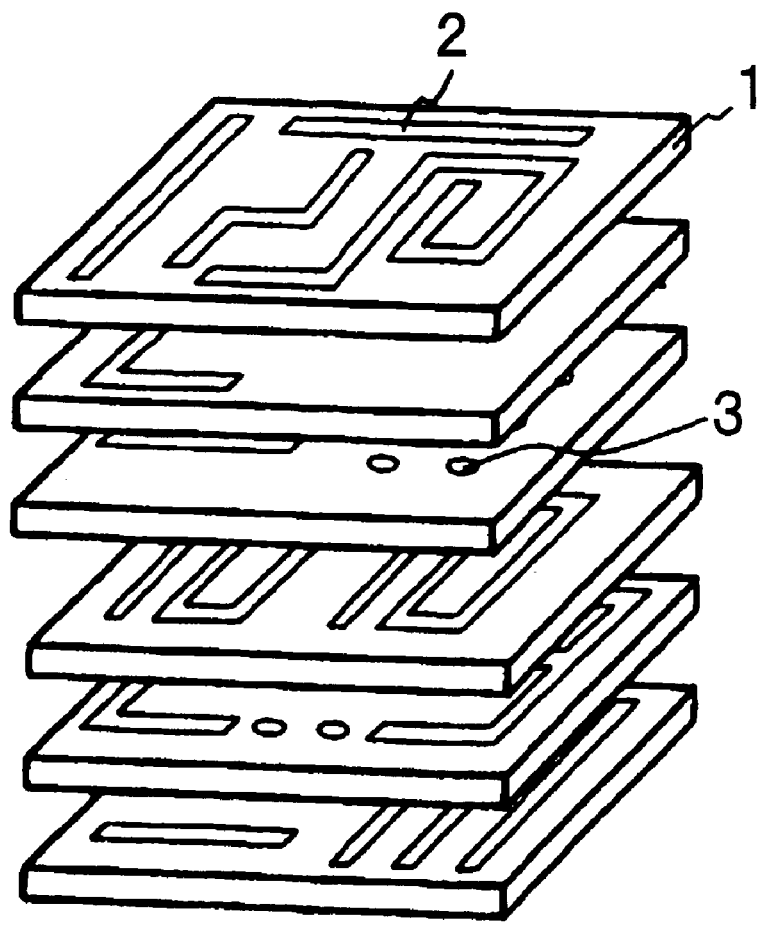
FIG. 2 is an exploded perspective view which shows an embodiment of a multilayer ceramic part in accordance with the present invention.

FIG. 1 is a perspective view showing one embodiment of a multilayer ceramic part of the present invention and FIG. 2 is an exploded perspective view thereof. As shown in FIGS. 1 and 2, a conductive layer 2 is formed on a dielectric layer 1. The conductive layer 2 constitutes a circuit such as an inductor or a capacitor. The dielectric layer 1 may or may not have a via hole 3. Such dielectric layers 1 are stacked in a pile to constitute the multilayer ceramic part.

As described earlier, the multilayer ceramic part of the present invention can be obtained by firing multilayers of dielectric green sheets each consisting of a dielectric layer comprising the dielectric ceramic composition of the present invention and a conductive layer formed on a surface of the dielectric layer. For example, a dielectric material is first obtained in the same manner as in the preceding Example. A glass component and other additives, if necessary, are added to the dielectric material, followed by mixing in a ball mill. After addition of a polyvinyl butyral (PVB) based binder, the resultant is mixed in a ball mill to prepare a slurry. The slurry is then formed into a 50–100 μm thick sheet using a doctor blade equipment. The obtained sheet is cut into a desired size. An Ag paste is printed thereon in a desired pattern to provide a dielectric green sheet. 8–20 layers of such green sheets, as shown in FIGS. 1 and 2, are stacked in a pile, bonded compressively, debindered at 400° C. and then fired at 900° C.–1,000° C. for 2 hours, resulting in a multilayer ceramic part.

What is claimed is:

1. A dielectric ceramic composition characterized as containing a dielectric material which contains:

a dielectric composition represented by the compositional formula $a.Li_2O-b.(CaO_{1-x}-SrO_x)-c.R_2O_3-d.TiO_2$ (wherein x satisfies $0 \leq x < 1$; R is at least one selected from La, Y and other rare-earth metals; and a, b, c and d satisfy $0 < a \leq 20$ mol %, $0 \leq b \leq 45$ mol %, $0 < c \leq 20$ mol % and $40 \leq d \leq 80$ mol %);

$Bi_2O_3$; and at least one of oxides of Group 4 and Group 14 metallic elements of the Periodic Table, wherein said metallic oxide is at least one selected from $SiO_2$, $GeO_2$, $ZrO_2$, and $HfO_2$.

2. The dielectric ceramic composition as recited in claim 1, characterized in that the metallic oxide content e of said dielectric material is within the range $0 < e \leq 80$ mol %.

3. The dielectric ceramic composition as recited in claim 1, characterized in that the $Bi_2O_3$ content is up to 30 mol %.

4. The dielectric ceramic composition as recited in claim 1, characterized as further containing a glass component.

5. A multilayer ceramic part characterized in that said multilayer ceramic part is obtained by laminating a dielectric layer formed from a slurry containing the dielectric ceramic composition as recited in claim 1 with a conductive layer.

6. A multilayer ceramic part characterized in that said multilayer ceramic part is obtained by laminating a dielectric layer formed from a slurry containing the dielectric ceramic composition as recited in claim 4 with a conductive layer.

7. A dielectric ceramic composition, wherein x satisfies $0 < x < 1$.

* * * * *